United States Patent [19]

Arimatsu et al.

[11] Patent Number: 5,312,654
[45] Date of Patent: May 17, 1994

[54] METHOD FOR DIRECTLY MAKING PRINTING PLATES USING INK-JET SYSTEM

[75] Inventors: Seiji Arimatsu, Hirakata; Takakazu Hase, Nishinomiya; Koichi Kimoto, Hirakata, all of Japan

[73] Assignee: Nippon Paint Co., Ltd., Osaka, Japan

[21] Appl. No.: 947,506

[22] Filed: Sep. 17, 1992

[30] Foreign Application Priority Data

Sep. 17, 1991 [JP] Japan .................... 3-236163

[51] Int. Cl.⁵ .............................. B05D 1/36
[52] U.S. Cl. ............................ 427/511; 427/261; 427/553; 427/595
[58] Field of Search ............ 427/261, 511, 553, 595

[56] References Cited

U.S. PATENT DOCUMENTS

| 4,143,381 | 3/1979 | Downie ................... 346/1 |
| 4,686,138 | 8/1987 | Toyama et al. ........... 428/323 |

FOREIGN PATENT DOCUMENTS 3417582 11/1984 Fed. Rep. of Germany .

OTHER PUBLICATIONS

Fuji, Database WPiL, Section Ch, Week 8141, JP-A-56105960 (1981).
Toray, Database, WPiL, Section Ch, Week 8545, JP-A-60192693 (1984).
Canon I, Database WPiL, Section Ch, Week 8824, JP-A-63102936 (1988).
Canon II, Database WPiL, Section Ch, Week 8415, JP-A-59038087 (1984).

*Primary Examiner*—Bernard Pianalto
*Attorney, Agent, or Firm*—Wenderoth, Lind & Ponack

[57] ABSTRACT

Disclosed is a method for making printing plates which comprises:
forming an image on a substrate having an ink absorbing layer for lithographic plates by ink-jet printing using a photopolymerizable ink composition, and
exposing it to an active light in the wavelength region with which said ink composition is sensitized to cure the image.

3 Claims, No Drawings

METHOD FOR DIRECTLY MAKING PRINTING PLATES USING INK-JET SYSTEM

FIELD OF THE INVENTION

The present invention relates to methods for making lithographic printing plates. In particular, it relates to a method for directly making the lithographic printing plates by using ink-jet printing, which makes it possible to produce the lithographic plates directly from digital data output from computers, facsimiles, or the like without using any films having negative or positive images.

BACKGROUND OF THE INVENTION

Digitalization of information has made rapid progress in recent years throughout the process from manufacturing a block copy, an upper stream process of printing, to manufacturing a printing plate, thereby putting, for example, a photographic forme system of characters, by which a block copy of manuscripts can be readily prepared, or a scanner which directly reads picture images, to practical use. With this progress, there has arisen a demand for a direct plate-making method in which lithographic plates can be directly prepared from digital data output from computers, facsimiles, or the like without using a film for making printing plates.

As one example of the direct plate-making method, a method wherein an image or non-image portion is directly formed on a substrate by ink-jet printing is known to the art. The ink-jet printing system is a relatively rapid image output system and has a simple construction because it does not require any complex optical system. Therefore, the printing system makes an apparatus for making printing plates simple and the cost for making printing plates can be lowered since the maintenance labor is largely reduced.

As examples of the methods for preparing printing plates by using the ink-jet printing system, Japanese Kokai Publication 113456/1981 proposes the methods for preparing printing plates wherein ink-repelling materials (e.g. curable silicone) are printed on a printing plate by ink-jet printing. The printing plate obtained by this method is an intaglio printing plate in which the ink-repelling material formed on the surface of the substrate serves as a non-image part. As a result, the resolution of the printed images at shadow area or reversed lines is not so good. Moreover, a large amount of ink is needed in this method because the ink-repelling material must be deposited on the whole non-image part which occupies most of the surface of the printing plate, thereby delaying the printing process.

Japanese Kokai Publication 69244/1992 discloses a method for making printing plates comprising the steps of: forming a printed image on a recording material subjected to a hydrophilic treatment by ink-jet printing using a hydrophobic ink containing photocurable components; and exposing the whole surface to an active light. However, the surface of the substrate to be used for the lithographic plate is usually subjected to various treatments such as a mechanical graining, an anodizing or a hydrophilic treatment to obtain good hydrophilic property and water retention property. Therefore, even the use of an ink composition having a very high surface tension is resulted to form a poor image on the surface of the substrate because of ink spreading.

SUMMARY OF THE INVENTION

The present invention is intended to solve the above-described problems in the prior art, and its objective is to provide a method for directly making printing plates with which a lithographic plate excellent in resolution and printing durability can be easily manufactured from digital data output from computes, facsimiles, or the like without making use of films for making printing plates.

The present invention provides a method for making printing plates which comprises:

forming an image on a substrate having an ink absorbing layer for lithographic plates by ink-jet printing using a photopolymerizable ink composition, and exposing it to an active light in the wavelength region with which said ink composition is sensitized to cure the image.

DETAILED DESCRIPTION OF THE INVENTION

The photopolymerizable ink composition to be used in the present invention usually contains as essential components a photopolymerizable compound having at least one ethylenically unsaturated double bond in the molecule and a photopolymerization initiator. In the photopolymerizable ink composition according to the present invention, linear organic polymers, volatilization preventive agents, surfactants, heat polymerization inhibitors, coupling agents, dyes, viscosity adjusting agents and other additives (e.g. plasticizers) are further added, if necessary.

The photopolymerizable compounds are compounds which are able to cure the composition by addition polymerization with the effect of a photopolymerization initiator under light irradiation. These compounds include unsaturated carboxylic acids such as acrylic acid, methacrylic acid, itaconic acid and maleic acid; esters of polyhydroxy compounds such as ethylene glycol, tetraethylene glycol, neopentyl glycol, propylene glycol, 1,2-butanediol, trimethylolpropane, pentaerythritol and di-pentaerythritol and the like with the above-described unsaturated carboxylic acids; adducts of epoxides such as trimethylolpropane polyglycidylether, pentaerythritol polyglycidylether, propylene glycol diglycidylether, reaction product of epichlorohydrin with 2,2-bis(4-hydroxyphenyl)propane, diglycidyl ester of phthalic acid and the like with the above-described unsaturated carboxylic acids; and acrylamides and methacrylamides such as acrylamide, ethylene bis-acrylamide, ethylene bis-methacrylamide and hexamethylene bis-methacrylamide; and the like. Acrylic acid esters, methacrylic acid esters, acrylamides and methacrylamides are preferable. These photopolymerizable compounds are present in the photopolymerizable ink compositions according to the present invention in an amount of 20 to 99.9% by weight, preferably 25 to 99% by weight, more preferably 30 to 98% by weight. When the content of the photopolymerizable compounds is less than 20% by weight, the printing durability of the printing plate obtained will be deteriorated.

The photopolymerization initiators are compounds which generate radical species by absorbing the light from ultraviolet and visible, and the compounds listed below can be used alone or in combination with each other. They are benzophenones such as benzophenone, methyl o-benzoylbenzoate, N,N'-tetraethyl-4,4'-diaminobenzophenone, Michler's ketone and thio- Michler's ketone; acetophenones such as 2,2-dimethoxyacetophenone, 2,2-diethoxyacetophenone, 2,2-dimethoxy-2-phenylacetophenone, α-hydroxycyclohexyl phenyl ketone, 2-hydroxy-2-methyl-1-phenylpropanone-1,2-methyl-1-[4-(methylthio)phenyl]-2-morpholinopropane-1; benzoins and their alkyl ethers such as benzoin, benzoin methyl ether, benzoin isopropyl ether and benzoin isobutylether; ethyl p-dimethylaminobenzoate; ethyl p-diethylaminobenzoate; thioxanthones such as thioxanthone, 2-ethylthioxanthone, 2,4-diethylthioxanthone and 2-chlorothioxanthone; 2-ethylanthraquinone; 9-phenylacridine; 9-p-methoxyphenylacridine; 9,10-dimethylbenzphenazine; 6,4',4''-trimethoxy-2,3-diphenylquinoxaline; peroxides such as benzoyl peroxide, di-t-butyl peroxide, dicumyl peroxide and cumene hydroperoxide; 2-nitrofluorene; 2,4,6-triphenylpyrillium tetrafluoroborate; 2,4,6-tris(trichloromethyl)-1,3,5-triazine; N-aryl-α-amino acids such as N-phenylglycine and N-(p-chlorophenyl)glycine; and diaryllodonium salts such as diphenyliodonium salt and bis(p-chlorophenyl)iodonium salt. In addition, polycyclic aromatic hydrocarbons such as anthracene, phenanthrene and perylene; coumarin series of dyes such as 3,3'-carbonylbiscoumarin; or dyes such as rose bengal and eosin; xanthene or thioxanthene dyes; and cyanine or melocyanine dyes can also be used. Of these compounds, those sensitized with visible light and having high sensitivity are preferable considering the fact that a light irradiation is carried out to cure selectively the photopolymerizable ink compositions after a printing image pattern has been formed with the ink-jet printing system. Examples of these compositions are described in Japanese Kokai Publications 114139/1982, 142205/1984, 180946/1988 and Japanese Patent Application Ser. No. 171068/1991. These photopolymerization initiators are used in an amount of from 0.1 to 50% by weight, preferably 1 to 30% by weight, more preferably 2 to 20% by weight in the photopolymerizable ink compositions according to the present invention. When the content of the photopolymerization initiator is less than 0.1% by weight, the printing durability of the printing plate decreases since curing of the image parts is insufficient. Storage stability of the photopolymerizable ink compositions will be reduced when the content is above 50% by weight.

The printing durability can be improved by improving the physical characteristics, such as strength and wear resistance of the photopolymerizable ink compositions after curing. Linear organic polymers are blended with the photopolymerizable ink compositions according to the present invention to improve the physical characteristics of the photopolymerizable ink compositions after curing. Compounds which have a good compatibility with the above-described photopolymerizable compounds and which do not extremely increase the viscosity of the photopolymerizable ink compositions after the blending are preferable for such polymers. Examples of them are copolymers of (meth)acrylic acid with alkyl (meth)acrylates and/or (meth)acrylonitrile and the like; copolymers of itaconic acid with alkyl (meth)acrylates and/or (meth)acrylonitrile and the like; copolymers of crotonic acid with alkyl (meth)acrylate and/or (meth)acrylonitrile and the like; copolymers of vinyl acetate with alkyl (meth)acrylate; copolymers of partially esterified maleic acid with alkyl (meth)acrylates and/or (meth)acrylonitrile; copolymers of maleic anhydride with substituted or unsubstituted styrene, unsaturated hydrocarbons, and unsaturated ethers and-/or unsaturated esters; esterification products of maleic anhydride copolymers; esterification products of copolymers having hydroxy groups with dicarboxylic anhydrides or polycarboxylic anhydrides; copolymers of hydroxyalkyl (meth)acrylate with alkyl (meth)acrylate and/or (meth)acrylonitrile and the like; copolymers of allyl alcohols with substituted or unsubstituted styrenes; copolymers of vinyl alcohols with alkyl (meth)acrylate or other photopolymerizable unsaturated compounds; modified compounds of acidic cellulose having carboxyl groups in their side chains; polyurethane (having a sufficient numbers of free OH groups); epoxy resins; polyesters; partially saponified vinyl acetate copolymers; polyvinylacetal having free OH groups; copolymers of hydroxystyrene with alkyl (meth)acrylate and the like; phenol/formaldehyde resins; polyethylene oxide, polyvinylpyrrolidone, or polyethers or polyamides of epichlorohydrin with 2,2-bis-(4-hydroxyphenyl)-propane. Functional groups capable of cross-linking such as (meth)acryloyl group and cinnamoyl group can be contained in such linear organic polymers. The linear organic polymers are used in the photopolymerizable ink compositions according to the present invention in an amount from 10 to 80% by weight, preferably 15 to 70% by weight, more preferably 20 to 50% by weight. When the content of the linear organic polymers is less than 10% by weight, effects of the improvement of the physical characteristics of the photopolymerizable ink compositions after curing are not sufficiently realized. When the content is over 80% by weight, on the other hand, light curing characteristics of the photopolymerizable ink compositions are decreased, thereby making the compositions unsuitable for the ink-jet system due to their viscosity increase.

A volatilization preventive agent is added to the photopolymerizable ink compositions according to the present invention, if necessary, to suppress evaporation of the ink solvent in the ink-jet nozzle and to prevent plugging due to precipitation of the dissolved components. Examples of the agent are bifunctional alcohols such as ethylene glycol, diethylene glycol, triethylene glycol, tetraethylene glycol, propylene glycol, dipropylene glycol and polyethylene glycol; trifunctional alcohols (e.g. glycerol). Glycerol is preferable among them. Two or more kinds of these polyfunctional alcohols can be used in combination with each other. The volatilization preventive agents are used in an amount from 0.5 to 40% by weight, preferably from 1 to 20% by weight, more preferably 2 to 15% by weight in the photopolymerizable ink compositions according to the present invention. When the content of the volatilization preventive agent is less than 0.5% by weight, it sometimes happens that a volatilization preventive effect can not be obtained sufficiently. When the amount is over 40% by weight, on the contrary, the physical characteristics of the photopolymerizable ink compositions deteriorate, thereby making the printing durability of the printing plate not so good.

A surfactant is further added to the photopolymerizable ink compositions according to the present invention to adjust the size of droplets of the photopolymerizable ink composition blowing out from the ink-jet nozzle, to adjust the surface tension of the photopolymerizable ink composition so that images can be formed in high resolution, and to prevent spreading and repelling from occurring when the images are formed on the ink absorbing layer of the substrate. Any surfactants with which the surface tension of the photopolymerizable ink compositions can be adjusted to a desired value are acceptable, and they are not limited to anyone of nonionic, cationic or anionic compound. Use of the nonionic surfactants are preferable when a continuous type apparatus is used for forming the images in the ink-jet system, since the photopolymerizable ink compositions are required to be charged at the tip of the ink-jet nozzle and the charged ink droplets must be forced to deflect while they are passing through an electric field formed.

Examples of these surfactants to be used are polyethyleneglycol alkyl ethers or alkylphenyl ethers such as polyethyleneglycol lauryl ether and polyethyleneglycol nonylphenyl ether; fatty acid diethanolamides; sodium alkylnaphthalene sulfonate; polyethyleneglycol nonylphenyl ether sulfate; polyethyleneglycol lauryl ether triethanolamine sulfate; phosphates of polyethyleneglycol alkyl ether or alkylphenyl ether; or their combinations. The surfactant may be present in an amount of 0.1 to 5% by weight, preferably 0.2 to 4% by weight, more preferably 0.3 to 3% by weight. An amount of more than 0.1% by weight of these surfactants contained in the photopolymerizable ink compositions is sufficiently effective, and the amount of more than 5% by weight is too much since an increased amount of them will not result in an insufficient curing of the photopolymerizable ink compositions.

Additives, such as silane coupling agents can be added to the ink compositions according to the present invention to improve adhesion to the substrate described above. When a large amount of the compound having unsaturated double bonds is included in the photopolymerizable composition, the silane coupling agents having terminal groups such as vinyl, acryloyl and methacryloyl groups) are used preferably as described in Japanese Patent Application Ser. No. 28775/1990. The silane coupling agent may be present in an amount of 0.1 to 15% by weight, preferably 0.5 to 10% by weight, more preferably 1 to 8% by weight.

A condensation product of diazodiphenylamine with paraformaldehyde conventionally used in the negative type PS plate (e.g. diazo compounds as described in Japanese Patent Application Ser. No. 20919/1991) can be added to improve light curing properties of the photopolymerizable ink compositions formed on the substrate.

Other components can be further added, if necessary, to the photopolymerizable ink compositions according to the present invention. For example, a small amount of colorant or dye can be added when the images formed on the substrate are recognized visually; or heat polymerization inhibitors, disinfectants, anti-contamination agents and anti-fungal agents can be also added. A small amount of solvent like water may be added to adjust solubility of each component of the photopolymerizable ink composition and viscosity of it. The solvent may be present in an amount of 10 to 80% by weight, preferably 15 to 70% by weight, more preferably 20 to 50% by weight. When the content of the solvent is a little larger, the composition can be subjected to a drying process prior to the light exposure process. Use of buffers and solubilizers is effective to improve the solubility or dispersibility of the polymer. Addition of defoaming agents and foam suppressing agents are also possible to suppress foaming of the photopolymerizable ink compositions in the ink-jet nozzle.

Metal plates, plastic films, sheets of paper or their composite materials (for example, a sheet of paper laminated with metal foil or metal deposited plastic films) are listed as examples of the materials to be used for the substrate. Metals such as aluminum, magnesium, zinc, chromium, iron, nickel and their alloys are preferable from the viewpoint of dimensional stability and durability. Use of the aluminum plate is preferable since it gives a good hydrophilic property and water retention property at the time of printing. When an aluminum plate is used for the substrate, it is preferable to subject the plate to a graining treatment by using an appropriate method such as mechanical methods like ball polishing or brush polishing, chemical methods like etching with a solution containing an acid, or electrochemical methods like etching by electrolysis, followed by an anodizing treatment or a treatment with sodium silicate.

As described above, excess degree of ink spreading happens to occur on the surface of the substrate when the image parts are formed directly on the substrate described above with the ink-jet printing system using the photopolymerizable ink composition. Therefore formation of an ink absorbing layer on the surface of the substrate is necessary for the purpose of preventing these phenomena to manufacture a printing plate excellent in resolution. The ink absorbing layer can be formed from a linear organic polymer composition which is able to form a film and contains various kinds of additives.

Any materials are appropriate for the linear organic polymer to be used for the ink absorbing layer, provided that they can form a film on the substrate of the lithographic plate and absorb and hold the photopolymerizable ink composition used for printing. However, since the ink absorbing layer must be eliminated after the formation of the image to expose the surface previously subjected to a hydrophilic treatment, the polymer should preferably be soluble in the aqueous alkaline solution or water from a viewpoint of safety and sanitation. Water soluble property is particularly preferable when this ink absorbing layer is eliminated with a dampening water supplied to the plate surface at the time of printing.

Examples of the polymers soluble in the aqueous alkaline solution are the linear organic polymers which can be used for the photopolymerizable ink compositions described above. Polymers soluble in the aqueous alkaline solution and used for the conventional PS plates can also be appropriately used. The polymers for the negative type PS plates as described in Japanese Patent Applications 20919/1991 or 36029/1991, or the polymers for the positive type PS plates as described in Japanese Patent Application 36029/1991 can also be used. The following water soluble polymers may be added as the second components to facilitate the elimination of the ink absorbing layer.

While polyvinylalcohol and its derivatives, polyvinylether, cellulose such as hydroxymethyl cellulose and hydroxyethyl cellulose, water-soluble alkyd resins, polyethylene oxide, polyvinyl pyrrolidone, polyacrylic acid and its sodium salt, sodium alginate, Pluran, water soluble nylon like polyamides, maleic acid copolymers, and water-soluble natural gum like gum arabic and the like can be appropriately used for the examples of the water-soluble polymers usable for the ink absorbing layer, cellulose such as hydroxymethyl cellulose, hydroxyethyl cellulose and hydroxypropyl cellulose, sodium alginate and water-soluble gum arabic are preferable.

The polymer for the ink absorbing composition may be present in an amount of 50 to 110% by weight, preferably 60 to 99.9% by weight, more preferably 70 to 99.9% by weight, based on the total ink absorbing polymer composition.

Desensitizing solution for the offset lithographic plate which are commercially available can also be used appropriately, and those containing water-soluble gum arabic in the solution are preferable. Polymers with a high acid value used for the light-sensitive compositions as described in Japanese Kokai Publication 311847/1990, and compositions prepared by combining (meth)acrylamides can be used for the ink absorbing layers.

Additives like silane coupling agents may be added to the ink absorbing layer compositions to enhance the adhesive property of the photopolymerizable ink compositions to the substrate. As described previously, the silane coupling agents whose molecular terminals at one end are vinyl group, acryloyl group or methacryloyl group as described in Japanese Patent Application 287751/1990 can be appropriately used. The silane coupling agent may be present in an amount of 0.1 to 15% by weight, preferably 0.5 to 10% by weight, more preferably 1 to 8% by weight, based on the total ink absorbing polymer composition.

Compounds containing ethylenically unsaturated double bonds and having an ability for addition reactions, which can be used for the photopolymerizable ink compositions, may be added in the ink absorbing layer compositions to enhance the printing durability of the printing plate obtained. In this case, the ink absorbing layer is cured in its image portion by the photopolymerization initiator contained in the photopolymerizable ink compositions which are absorbed into the ink absorbing layer. Light curing property of the image parts of the ink absorbing layer can be improved by the addition of diazonium salts or diazo resins into the ink absorbing layer as observed in the case of the photopolymerizable ink compositions. The compound having ethylenically unsaturated double bonds may be present in an amount of 1 to 50% by weight, preferably 5 to 40% by weight, more preferably 10 to 30% by weight, based on the total ink absorbing polymer composition.

When the photopolymerizable ink composition absorbed into the ink absorbing layer spreads in the horizontal direction, the resolution of the printing plate deteriorates. An addition of surface energy adjusting agents such as fluorine series of surfactants or silicone series of surfactants is preferable to prevent this spreading. They may be compounds containing ethylenically unsaturated double bonds and having an ability for addition reactions, which contain fluorine atoms or silicone atoms in the molecule. When the ink absorbing layer contains Novolac resins and the like which are used for the polymers for positive type PS printing plate as a main component, an addition of phenol resins such as t-butylphenol formaldehyde or octylphenol formaldehyde is also effective.

The light-polymerization initiators and sensitizers can be added to the ink absorbing layer compositions when any light-polymerizable compound does not exist in the ink absorbing layer composition or, even when existing, the amount is so small that any solvent-insoluble polymer is not formed by a polymerization. As a result, it is possible to reduce the amount of the photopolymerization initiator and sensitizer contained in the photopolymerizable ink composition, thereby improving the stability of the photopolymerizable ink composition during storage. It is preferred that the initiator is present in an amount of 0.1 to 30% by weight, particularly 0.3 to 20% by weight, more particularly 0.5 to 10% by weight, based on the total ink absorbing polymer composition.

In the preferred embodiment of the present invention, the ink absorbing layer is formed, by using a conventional coating apparatus such as bar coater, spinner, roll coater, knife coater and curtain flow coater, by coating the surface of the substrate with the ink absorbing layer composition, containing the above-described components in an appropriate ratio, in an amount of coating of 0.02 to 2.00 g/m$^2$, preferably 0.05 to 1.00 g/m$^2$, followed by drying. The image parts are allowed to be cured by the steps comprising: forming the image on the surface of the ink absorbing layer with the ink-jet system using the light-polymerizable ink compositions; drying this image if necessary; and irradiating the whole surface of the absorbing layer to a light. Then, a printing plate is prepared by eliminating the polymer soluble in plain water or an aqueous alkaline solution contained in the ink absorbing layer by using an appropriate solvent such as plain water or an aqueous alkaline solution like an aqueous sodium methasilicate solution, aqueous sodium carbonate solution or aqueous triethanolamine solution, or a commercially available developer for the offset lithographic plate. If the ink absorbing layer consists of water soluble polymer, the printing plate is also prepared by eliminating the water soluble polymer with the damping water supplied to the printing plate at the time of printing. Thus, the surface of the substrate corresponding to the non-image parts is exposed.

DETAILED DESCRIPTION OF THE PREFERRED EMBODIMENTS

Although the present invention will be described in more detail referring to the following examples, it is by no means limited to the descriptions as set forth therein. The amount of blending is expressed hereinafter in parts by weight unless otherwise described.

EXAMPLE 1

The printing plates obtained by a different combination of the photopolymerizable ink compositions with the water soluble ink absorbing layer, respectively, are described in this example.

The photopolymerizable ink compositions 1 to 6 were prepared as prescribed in Table 2 by using the photopolymerizable compounds 1 to 6, respectively, listed in Table 1.

TABLE 1

| | |
|---|---|
| 1) | Diethylene glycol dimethacrylate |
| 2) | Dipropylene glycol dimethacrylate |
| 3) | Polyethylene glycol dimethacrylate |
| 4) | Glycerine dimethacrylate |
| 5) | Trimethylolpropane trimethacrylate |

TABLE 1-continued

6) Reaction product of ethoxymethylacrylamide and dipropylene glycol[a]

[a] The structure of the photopolymerizable compound 6 is illustrated below.

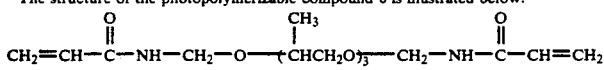

TABLE 2

| Photopolymerizable ink composition | |
| --- | --- |
| Photopolymerizable compound | 90.0 |
| Photopolymerization initiator[a] | 7.0 |
| Silane coupling agent[b] | 3.0 |
| Total | 100.0 |

[a] IR#651 made by Ciba Geigy Co.
[b] SZ-6030 made by Toray Silicone Co.

The ink absorbing compositions 1 to 7 were prepared as prescribed in Table 4 by using the water soluble compounds 1 to 7, respectively, listed in Table 3.

TABLE 3

| | |
| --- | --- |
| 1) | Sodium alginate |
| 2) | Polyethylene oxide |
| 3) | Polyvinyl pirrolidone |
| 4) | Pluran |
| 5) | Polyvinyl alcohol |
| 6) | Hydroxymethyl cellulose |
| 7) | Gum arabic |

TABLE 4

| Ink absorbing layer composition | |
| --- | --- |
| Water soluble polymer | 5.0 |
| DI water | 95.0 |
| Total | 100.0 |

Then, an ink absorbing layer was formed by coating the aluminum substrate for PS printing plate, the surface of which was roughened by mechanical polishing and electrochemical polishing and which was subjected to an anodizing and sodium silicate treatment, with the ink absorbing compositions 1 to 7, respectively, to a dried coating amount 0.3 g/m², followed by drying.

An image was formed on this ink absorbing layer with an ink-jet printer HG-800 made by Epson Co. by using the photopolymerizable ink compositions 1 to 6, respectively. The surface of the ink absorbing layer bearing image parts was then exposed to a light from high pressure mercury lamp (output 6 kW) and the ink absorbing layer at non-image area was eliminated by washing with water, thereby obtaining a lithographic plate. The quality of images of the printing plate obtained was evaluated. The results are shown in Table 5.

TABLE 5

Image quality of various printing plates obtained

| | Ink Composition | | | | | |
| --- | --- | --- | --- | --- | --- | --- |
| | 1 | 2 | 3 | 4 | 5 | 6 |
| No absorbing layer | 1 | 1 | 1 | 1 | 1 | 1 |
| Absorbing layer 1 | 2 | 2 | 3 | 6 | 3 | 6 |
| Absorbing layer 2 | 2 | 2 | 4 | 8 | 3 | 4 |
| Absorbing layer 3 | 3 | 4 | 4 | 8 | 6 | 4 |
| Absorbing layer 4 | 2 | 3 | 5 | 8 | 5 | 5 |
| Absorbing layer 5 | 2 | 3 | 5 | 8 | 4 | 6 |
| Absorbing layer 6 | 7 | 7 | 8 | 8 | 8 | 8 |

TABLE 5-continued

Image quality of various printing plates obtained

| | Ink Composition | | | | | |
| --- | --- | --- | --- | --- | --- | --- |
| | 1 | 2 | 3 | 4 | 5 | 6 |
| Absorbing layer 7 | 7 | 8 | 8 | 8 | 6 | 8 |

Quality evaluation standard for printing image
8 Good
7 Nearly good
6 Slightly spread
5 Spread
4 Significantly spread
3 Vigorously spread
2 Fairly vigorously spread
1 Very vigorously spread

EXAMPLE 2

Printing plates manufactured by using photopolymerizable ink compositions containing water are described in this example.

Lithographic printing plates were obtained by the same method as described in Example 1, except that the photopolymerizable ink compositions prescribed in Table 6 were used, an aqueous solution of polyvinylalcohol or hydroxypropyl methylcellulose was used for the ink absorbing layer composition, and the ink image was dried for 1 min. at 80° C. prior to exposure. An evaluation of the quality of the image of the lithographic printing plate obtained gave a good result (rated 8 according to the quality standard in Example 1) without any spread for the above two cases.

TABLE 6

| Photopolymerizable ink composition | |
| --- | --- |
| Polyethylene glycol dimethacrylate | 90.0 |
| Photopolymerization initiator | 7.0 |
| Silane coupling agent | 3.0 |
| DI water | 80.0 |
| Total | 180.0 |

EXAMPLE 3

Printing plates manufactured by using an ink absorbing layer soluble in an aqueous alkaline solution are described in this example.

Lithographic printing plates were obtained by the same method as described in Example 1, except that diethylene glycol dimethacrylate was used for the photopolymerizable compound, the ink absorbing layers were formed by coating the plate with the ink absorbing layer compositions as prescribed in Table 7 and Table 8 to form a dried coating amount of 0.2 g/m² followed by drying, and the ink absorbing layer at the non-image area was eliminated by washing with a commercially available developer for the positive type PS plate. An evaluation of the quality of the images of the lithographic printing plates gave good results without any spread for all cases.

TABLE 7

| Ink absorbing layer composition 1 | |
| --- | --- |
| Acrylic resin ($M_w$ = 200,000, acid value 19) | 3.4 |
| Styrene-maleic acid half ester | 1.9 |

TABLE 7-continued

| Ink absorbing layer composition 1 | |
|---|---|
| ($M_w$ = 20,000, acid value 180) | |
| Polyethylene glycol dimethacrylate | 3.0 |
| Methyl ethyl ketone | 91.7 |
| Total | 100.0 |

TABLE 8

| Ink absorbing layer composition 2 | |
|---|---|
| Cresol-Novolac resin (meta/para ratio = 6/4, $M_w$ = 7000) | 5.00 |
| Condensation product of p-octylphenol with formaldehyde | 0.25 |
| Propylene glycol monomethylether | 94.75 |
| Total | 100.00 |

EXAMPLE 4

Printing plates manufactured by using water soluble ink absorbing layers are described in this example.

Lithographic printing plates were obtained by the same method as described in Example 1, except that diethylene glycol dimethacrylate was used for the photopolymerizable compound, and the ink absorbing layers were formed by coating the plate with the ink absorbing layer compositions as prescribed in Table 9 and Table 10 to form a dried coating amount of 0.3 g/m², followed by drying. An evaluation of the quality of printing of the lithographic printing plates gave a good result without any spread for all cases.

TABLE 9

| Ink absorbing layer composition 1 | |
|---|---|
| Acrylic resin ($M_w$ = 40,000, acid value 117) | 3.68 |
| DMA-3EOMAl addition compound[a] | 2.22 |
| Propylene glycol monomethylether | 94.10 |
| Total | 100.00 |

[a] The structure of DMA-3EOMAl addition compound is shown below:

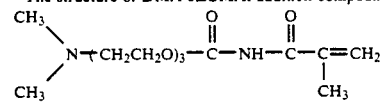

TABLE 10

| Ink absorbing layer composition 2 | |
|---|---|
| Gum solution for PS plate (solid content 20%) | 5.0 |
| DI water | 95.0 |
| Total | 100 |

EXAMPLE 5

The relation between the thickness of the ink absorbing layer and the performance of the printing plate obtained is described in this example.

Lithographic printing plates were obtained by the same method as described in Example 1, except that diethylene glycol dimethacrylate was used for the photopolymerizable compound and ink absorbing layers were formed by coating the plate with the ink absorbing layer composition 2 described in Example 4 in various amounts of coating. An evaluation of the quality of the images of the lithographic printing plates gave the results listed in Table 11.

TABLE 11

| Amount of coating (g/m²) | Quality of the image |
|---|---|
| 0.05 | Slightly spread |
| 0.17 | Nearly good |
| 0.31 | Good |
| 0.73 | Good |

EXAMPLE 6

Printing plates manufactured by using a Xenon lamp are described in this example.

Lithographic plates were obtained by the same method as described in Example 1, except that diethylene glycol dimethacrylate was used for the photopolymerizable compound, the compound illustrated below was used for the photopolymerization initiator, the ink absorbing layer composition 2 in Example 4 was used for the ink absorbing layer composition and the surface of the ink absorbing layer bearing image parts was exposed to a light beam of a Xenon lamp (output 150 W). An evaluation of the image quality of the lithographic plate gave a good result without any spread.

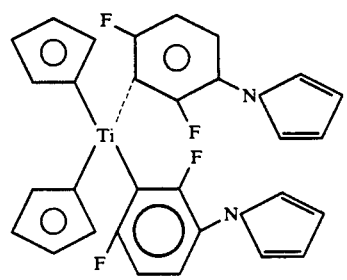

EXAMPLE 7

The printing durability of the printing plates according to the present invention is described in this example.

Lithographic printing plates were obtained by the same method as described in Example 1, except that the composition as prescribed in Table 12 was used for the photopolymerizable ink composition and the ink absorbing layer composition 2 in Example 4 was used for the ink absorbing layer composition. Printing was carried out by using Hamadastar 700CDX made by Hamada Printing Machine Co., obtaining 30,000 sheets of printed matter having good printing images.

TABLE 12

| Light polymerizable ink composition | |
|---|---|
| Diethylene glycol dimethacrylate | 40.0 |
| Dipropylene glycol dimethacrylate | 50.0 |
| Photopolymerization initiator[a] | 7.0 |
| Silane coupling agent[b] | 3.0 |
| Total | 100.0 |

The present invention provides a direct plate-making method capable of manufacturing a lithographic plate excellent in resolution and printing durability from digital data output from computers, facsimiles, or the like easily without making use of negative or positive films.

What is claimed is:

1. A method for making lithographic printing plates comprising:
    forming an image on a substrate having an ink absorbing layer and a hydrophilized layer between the substrate and absorbing layer by ink-jet printing using a photopolymerizable ink composition, and exposing it to an active light in the wavelength region with which said ink composition is sensitized to cure the image.

2. The method for making printing plates according to claim 1 wherein said ink absorbing layer is formed from an alkali soluble or water soluble polymer.

3. The method for making printing plates according to claim 1 wherein said ink absorbing layer is coated on the substrate in an amount of 0.02 to 2.00 g/m².

* * * * *